(12) United States Patent
Shah et al.

(10) Patent No.: US 8,269,209 B2
(45) Date of Patent: Sep. 18, 2012

(54) ISOLATION FOR NANOWIRE DEVICES

(75) Inventors: Uday Shah, Portland, OR (US);
Benjamin Chu-Kung, Hillsboro, OR (US); Been Y. Jin, Lake Oswego, OR (US); Ravi Pillarisetty, Portland, OR (US); Marko Radosavljevic, Beaverton, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 213 days.

(21) Appl. No.: 12/653,847

(22) Filed: Dec. 18, 2009

(65) Prior Publication Data
US 2011/0147697 A1 Jun. 23, 2011

(51) Int. Cl.
*H01L 29/06* (2006.01)
(52) U.S. Cl. ............... 257/9; 257/E29.168; 257/E21.09; 257/24; 257/19; 257/E29.072; 257/E21.403; 977/762; 977/938
(58) Field of Classification Search .................. None
See application file for complete search history.

(56) References Cited

U.S. PATENT DOCUMENTS

| | | | | |
|---|---|---|---|---|
| 7,446,025 | B2 * | 11/2008 | Cohen et al. | 438/583 |
| 2004/0065930 | A1 * | 4/2004 | Lin et al. | 257/412 |
| 2005/0136585 | A1 | 6/2005 | Chau et al. | |
| 2007/0145375 | A1 * | 6/2007 | Cho | 257/75 |
| 2008/0224122 | A1 * | 9/2008 | Saitoh et al. | 257/14 |
| 2008/0237575 | A1 | 10/2008 | Jin et al. | |
| 2008/0237684 | A1 * | 10/2008 | Specht et al. | 257/316 |
| 2009/0061568 | A1 | 3/2009 | Bangsaruntip et al. | |
| 2009/0170251 | A1 | 7/2009 | Jin et al. | |
| 2009/0200536 | A1 * | 8/2009 | Van Schaijk et al. | 257/4 |

FOREIGN PATENT DOCUMENTS
WO 2011/075228 A2 6/2011

OTHER PUBLICATIONS
International Search Report and Written Opinion received for PCT Patent Application No. PCT/US2010/055225, mailed on Jul. 1, 2011, 8 pages.

* cited by examiner

*Primary Examiner* — Fei Fei Yeung Lopez
(74) *Attorney, Agent, or Firm* — Winkle, PLLC

(57) ABSTRACT

The present disclosure relates to the field of fabricating microelectronic devices. In at least one embodiment, the present disclosure relates to forming an isolated nanowire, wherein isolation structure adjacent the nanowire provides a substantially level surface for the formation of microelectronic structures thereon.

18 Claims, 8 Drawing Sheets

ISOLATION FOR NANOWIRE DEVICES

BACKGROUND OF THE INVENTION

Microelectronic integrated circuits, such as microprocessors, comprise literally hundreds of millions of transistors. The speed of the integrated circuits is primarily dependent on the performance of these transistors. Thus, the industry has developed unique structures, such as non-planar transistors and high mobility carriers for these transistors.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
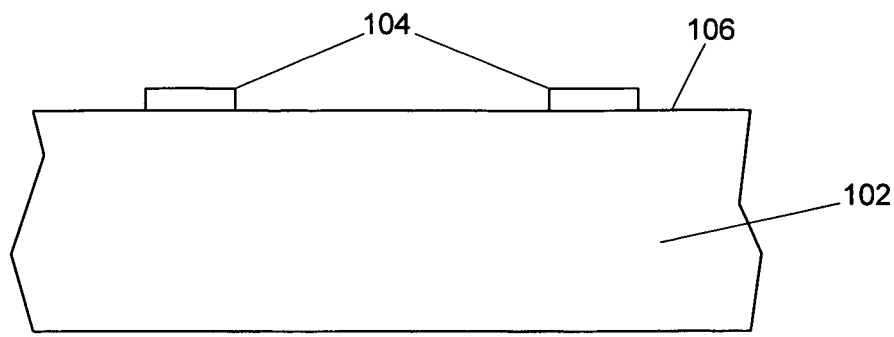
FIG. 1 is a side cross-sectional view of a silicon-containing substrate having a mask patterned thereon.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the fabrication of microelectronic devices. In at least one embodiment, the present subject matter relates to forming isolated a nanowire, wherein an isolation structure adjacent the nanowire provides a substantially level surface for the formation of microelectronic structures thereon.

Microelectronic devices, such as microprocessors, memory devices, and application specific integrated circuits, are formed from various electronic components, such as transistors, resistors, and capacitors, which are interconnected with traces to form circuits in and on microelectronic device wafers. The microelectronic device industry has continuously strived to reduce the size of these components, which results in faster and less expensive microelectronic devices. However, when the size of these components is reduced, problems may arise with regard to parasitic capacitance, off-state leakage, power consumption, and other performance characteristics of these microelectronic devices.

In the fabrication of the transistors, particularly metal oxide semiconductor field effect transistors, performance and reliability have been improved through the use of a variety of innovations such as the utilization of semiconductor-on-insulator substrates, the formation of selective epitaxially deposited raised source and drain, the formation of atomic layer deposited high-K gate dielectrics, the fabrication of metal gates, the formation of strained transistor channels, and the deposition of low-K interlevel dielectric layers.

As the size of transistors is decreased, the channel length of the transistor may be reduced, as will be understood by those skilled in the art. This channel length reduction generally results in an increased device speed, as gate delay typically decreases. However, negative side effects may occur when the channel length is reduced, including but not limited to, increased off-state leakage current due to threshold voltage roll-off, also referred to as short channel effects.

These negative side effects can be mitigated through the fabrication of high carrier mobility channels. Carrier mobility is generally a measure of the velocity at which carriers flow in a semiconductor material under an external unit electric field. In a transistor, carrier mobility is a measure of the velocity at which carriers (e.g., electrons and holes) flow through or across a device channel in an inversion layer. To further improve the performance of the transistors carrier mobility, structures and materials with higher mobility than that which can be delivered through the use of silicon alone must be used. Thus, unique structures, such as high mobility nanowires, have been fabricated to serve as channels. Employing a nanowire as a channel of a transistor tends to yield a transistor having a low power consumption, a high integration degree, and a rapid response speed.

These nanowires can be fabricated from a number of appropriate materials. However, it has been found that germanium can be conveniently formed into nanowires with techniques and machinery commonly used in the fabrication of integrated circuits. These germanium nanowires can be incorporated as high mobility transistor channels that are modulated by a gate in a transistor device to create logic, memory and low dimensional quantum transport devices. As devices continue to scale, the high mobility germanium nanowire devices may provide better control of short channel effects than silicon.

Embodiments of the subject matter of the present description are shown FIGS. 1-19. FIG. 1 illustrates a substrate 102, having a mask 104 patterned thereon (see also blocks 202 and 204 of FIG. 19). The substrate 102 may be a silicon-containing substrate, such as a mono-crystalline silicon wafer or any wafer or substrate having a high silicon content. The patterned mask 104 may be a photoresist material patterned on a first surface 106 of the substrate 102 by various lithographic techniques known in the art, and may be patterned as an array of substantially parallel lines.

Figure 2:
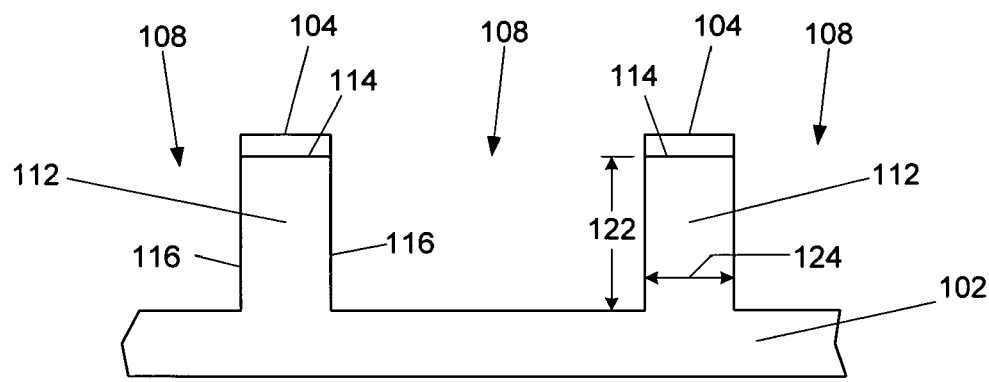
FIG. 2 is a side cross-sectional view of the silicon-containing substrate for FIG. 1 after etching to form fins.
Figure 19:
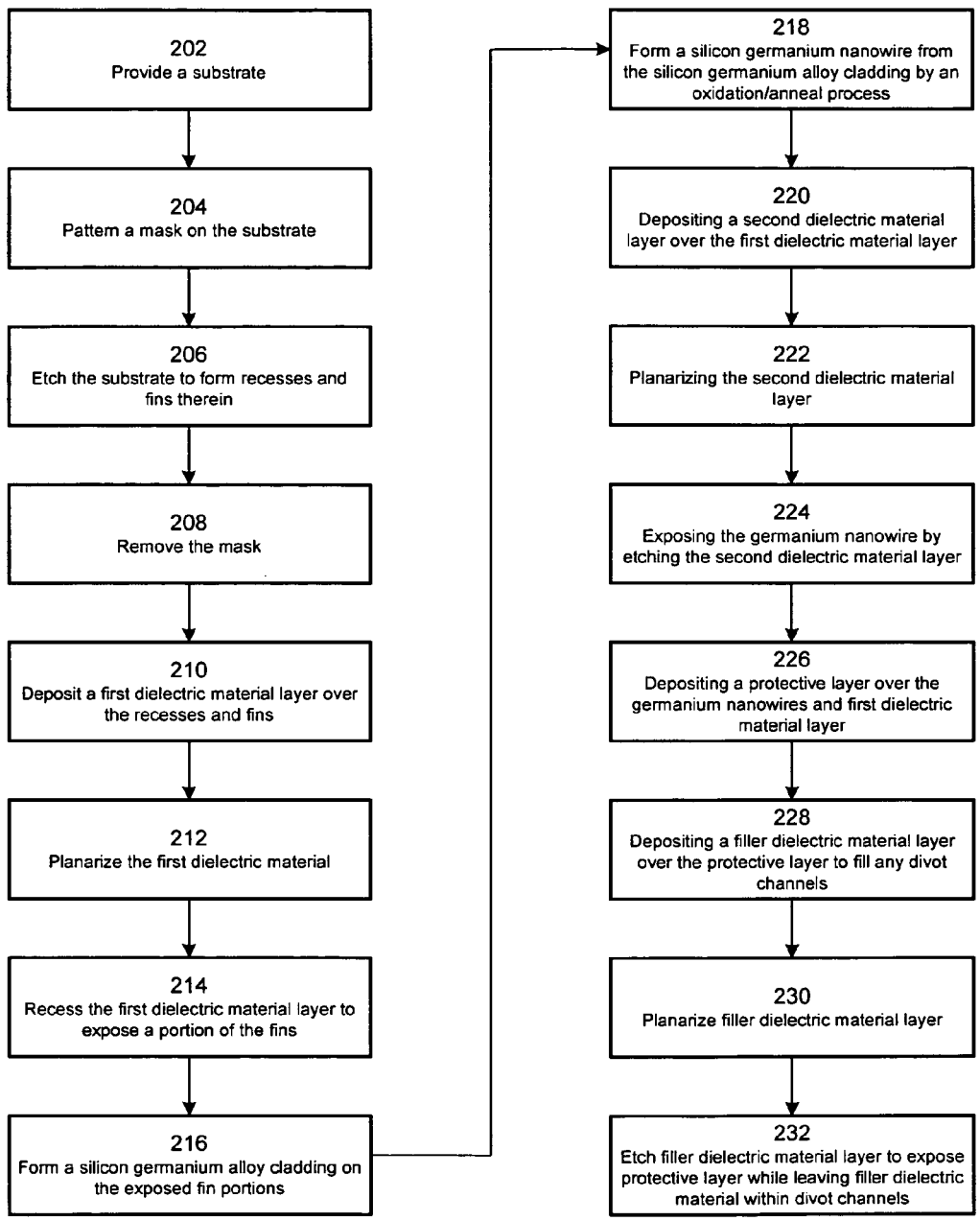
FIG. 19 is process flow of the fabrication of germanium nanowire.

As shown in FIG. 2 and as set forth block 206 of FIG. 19, the substrate 102 may be anisotropically etched to form recesses 108 therein. The patterned mask 104 blocks the etching thereby forming fins 112. The each fin 112 may include a top surface 114 and two opposing sides 116, such that each fin has a height 122 and a wide 124. In one embodiment, the fin width 124 may be between about 2 nm and 55 nm, and the fin height 122 between about 3 nm and 180 nm. Additionally, the fins 112 may be spaced (centerline to centerline) from between about 14 nm and 560 nm apart (not illustrated). The etching of the silicon-containing substrate 102 may be achieved with a wet etch, including, but not limited to nitric acid/hydrofluoric acid solution, or a dry etch, including, but not limited to plasma etching with a sulfur hexafluoride gas, dichlorodifluoromethane gas, or the like.

Figure 3:
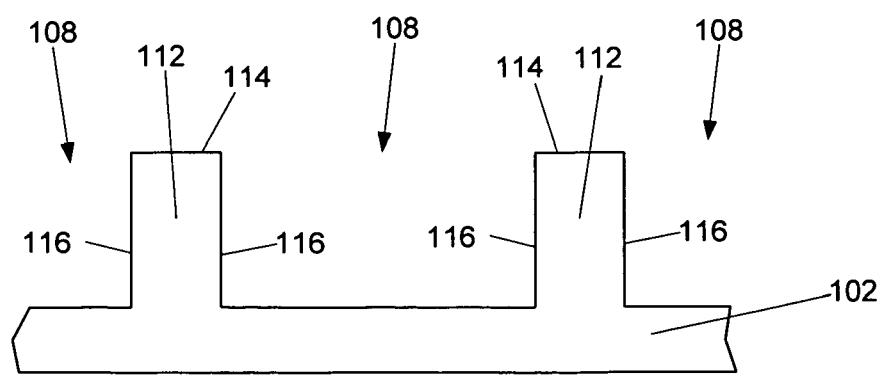
FIG. 3 is a side cross-sectional view of structure of FIG. 2 after the removal of the mask.
Figure 4:
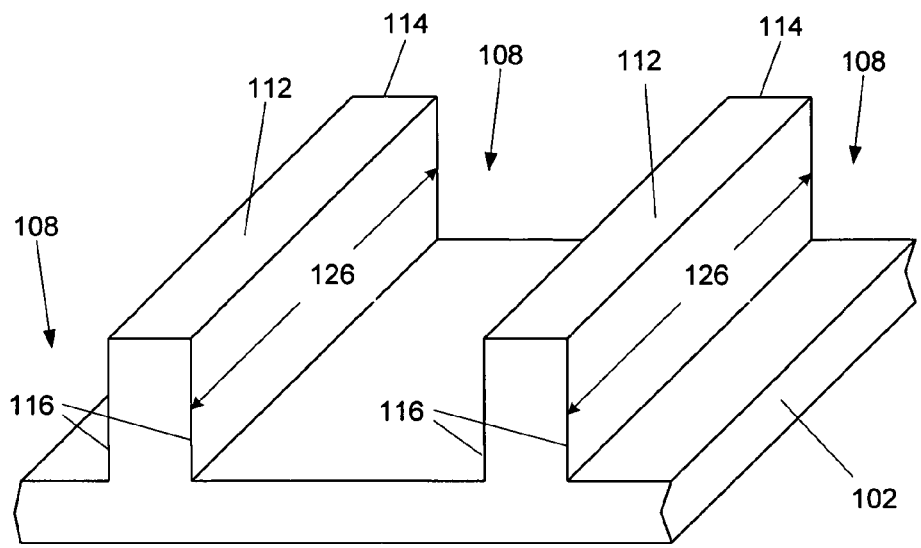
FIG. 4 is an oblique, cross-sectional view of the structure of FIG. 3.

As shown in FIG. 3 and as set forth in block 208 of FIG. 19, the patterned mask 104 is removed. The removal of the patterned mask 104 may be achieved with any known technique, including but not limited to chemical stripping and ashing (plasma in fluorine or oxygen). FIG. 4 illustrates an oblique view of the structure of FIG. 3 to assist in understanding the shape of the fins 112 and to illustrate a length 126 of each fin 112. The fin length 126 may be between about 5 um and 25 um.

Figure 5:
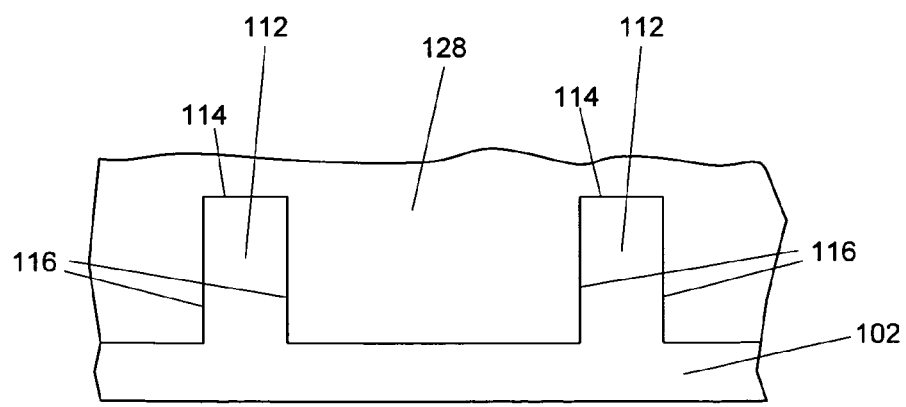
FIG. 5 is a side cross-sectional view of the structure of FIGS. 3 and 4 after the deposition of a first dielectric material layer.

After the patterned mask 104 has been removed, a first dielectric material layer 128, such as silicon oxide, may be formed over the recesses 108 and fins 112, as shown in FIG. 5 and as set forth in block 210 of FIG. 19. The first dielectric material layer 128 may by deposited to completely fill the recesses and may have an excess amount deposited to ensure complete coverage. The first dielectric material layer 128 may be deposited by any technique known in the art, including but not limited to, chemical vapor deposition, atomic layer deposition, physical vapor deposition, and the like.

Figure 6:
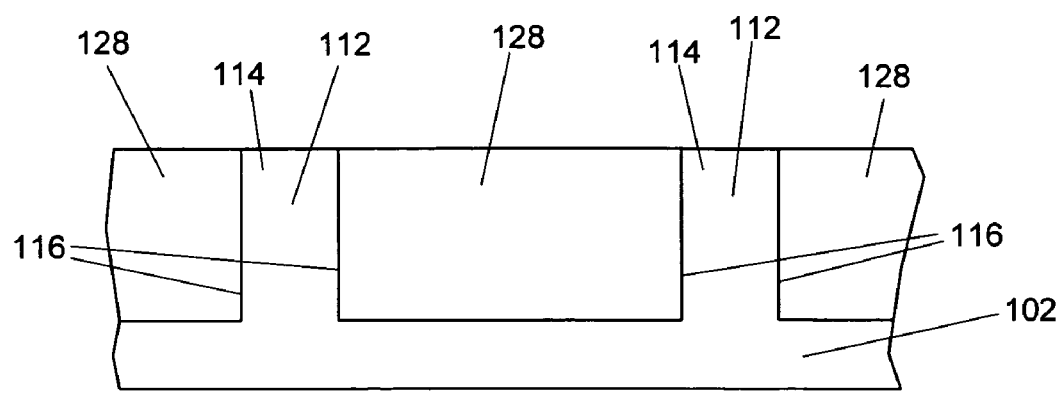
FIG. 6 is a side cross-sectional view of the structure of FIG. 5 after planarization of the first dielectric material layer.

As shown in FIG. 6 and as set forth in block 212 of FIG. 19, the first dielectric material layer 128 may be planarized. The planarization assists achieving an even and uniform etch in a subsequent step. In one embodiment, the first dielectric material layer 128 planarized to be even or substantially planar with the top surface 114 of each fin 112, such that the first dielectric material layer 128 within the recesses 108 (see FIG. 1) is at substantially the same height 122 as the fins 112. The planarization may be achieved by technique known in the art, including but not limited to chemical mechanical polishing/planarization ("CMP") and wet or dry etching.

Figure 7:
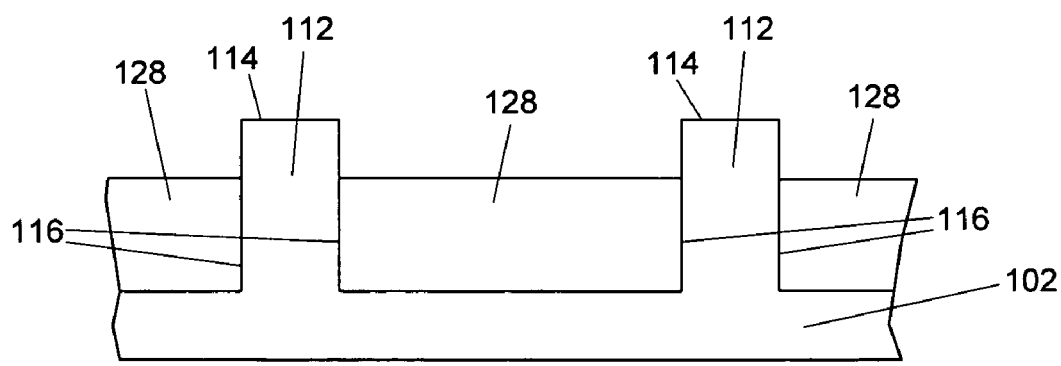
FIG. 7 is a side cross-sectional view of the structure of FIG. 6 after recessing the first dielectric material layer to expose portions of the fins.

As shown in FIG. 7 and as set forth in block 214 of FIG. 19, the first dielectric material layer 128 may be recessed (i.e., to a level lower that the fin top surface 114) to form a first surface 130 and to expose at least a portion of the fin sides 116 adjacent to the fin top surface 114. Recessing the first dielectric material layer 128 may be achieved by etching techniques known in the art. However, the etching technique may need to be selective relative to silicon or silicon-germanium, such that the fins 112 are not damaged by the recessing etch. In one embodiment, the recessing may be achieved with a wet etch using a dilute hydrofluoric acid solution.

Figure 8:
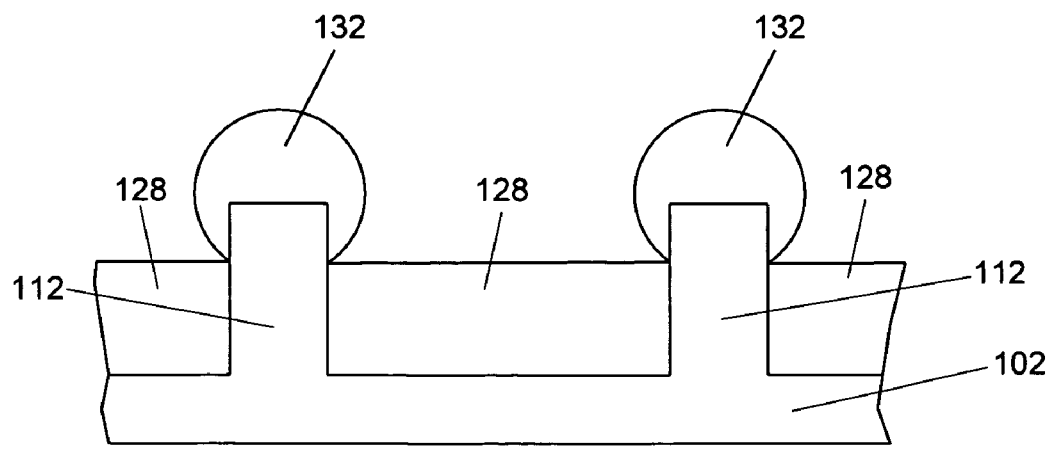
FIG. 8 is a side cross-sectional view of the structure of FIG. 7 after formation of a silicon germanium alloy cladding on exposed portions of the fins.

After recessing the first dielectric material layer 128, a silicon germanium alloy shell or cladding 132 may be selectively formed over on each fin top surface 114 and exposed portions of the fin sides 116, as shown in FIG. 8 and as set forth in block 216 of FIG. 19. In one embodiment of the present disclosure, the silicon germanium alloy cladding 132 may be formed with molecular beam epitaxy ("MBE"). In another embodiment of the present disclosure, the silicon germanium alloy cladding 132 is formed with atomic layer deposition ("ALD"). In still another embodiment of the present disclosure, the silicon germanium alloy cladding 132 may be formed with metal-organic chemical vapor deposition ("MOCVD").

In an embodiment of the present disclosure, the silicon germanium alloy cladding 132 may have a chemical formula of $Si_{1-x}Ge_x$, where $0.05<x<0.35$. In one embodiment of the present disclosure, the silicon germanium alloy cladding 132 may be intrinsic (undoped).

It is understood that the silicon germanium alloy cladding 132 grows epitaxially along certain axes (or directions) that depend upon the surface orientation of a crystal lattice of the fin 112 proximate the fin top surface 114 and exposed fin sides 116. Thus, the silicon germanium alloy cladding may form to resemble a tilted cube (not shown), a roof-like structure (not shown), or a multiple 125-degree faceted structure (not shown). For the sake of simplicity, the silicon germanium alloy cladding 132 is illustrated generically as semi-cylindrical, such that the cross-sectional view is semicircular.

Figure 9:
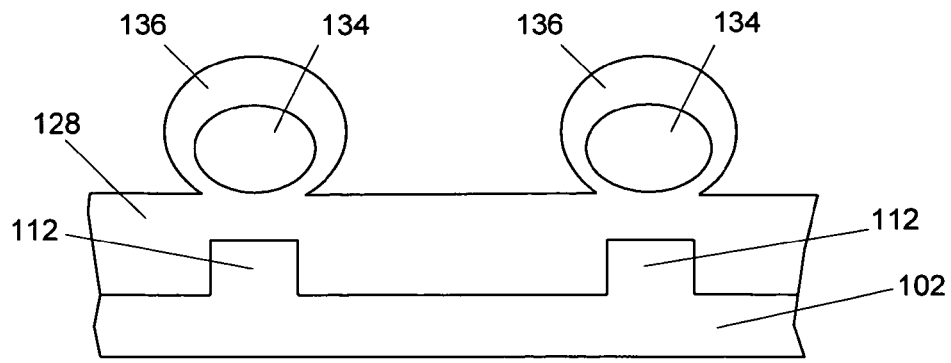
FIG. 9 is a side cross-sectional view of the structure of FIG. 8 after the formation of germanium nanowires.

As shown in FIG. 9 and as set forth in block 218 of FIG. 19, a germanium nanowire 134 is then formed by an oxidation/anneal process. In an embodiment of the present disclosure, the oxidation/anneal process comprises an oxidation step and the anneal step are performed at the same time (concurrent).

In another embodiment of the present disclosure, the oxidation/anneal process comprises an oxidation step followed by an anneal step (sequential). In yet another embodiment of the present invention, the oxidation/anneal process comprises repeated, alternating oxidation steps and anneal steps performed to reach progressively higher germanium content within the germanium nanowire 134, and to homogenize germanium content throughout the germanium nanowire 134.

In an embodiment of the present invention, the oxidation anneal includes a dry oxidation and an anneal performed, initially at about 1,050 degrees Centigrade to reach between about 60-65% germanium content within the germanium nanowire 134, followed by an anneal at about 900 degrees Centigrade to reach between about 75-98% Germanium content within the germanium nanowire 134.

In an embodiment of the present disclosure, the oxidation may be performed in dry (without water) oxygen mixed with a diluent gas or a carrier gas. In another embodiment of the present disclosure, the diluent gas or carrier gas is a non-oxidizing gas, such as nitrogen ($N_2$), or forming gas ($H_2/N_2$). In still another embodiment of the present disclosure, the diluent gas or carrier gas is an inert gas, such as argon (Ar), helium (He), and the like.

In an embodiment of the present disclosure, the anneal may be performed in a sub-atmosphere or a partial vacuum.

In one embodiment of the present disclosure, the oxidation/anneal process may be performed at a temperature below a melting point of the silicon germanium alloy cladding 132.

In another embodiment of the present disclosure, the oxidation/anneal process is performed at a temperature of between about 840-1,065 degrees Centigrade. In yet another embodiment of the present disclosure, the oxidation/anneal process may be performed above a temperature at which viscous flow of silicon oxide will occur (about 950 degrees Centigrade).

During the oxidation/anneal process, silicon and germanium will inter-diffuse depending on a concentration gradient and a thermal gradient, as will be understood to those skilled in the art. Silicon is thermally oxidized in a preferential manner over germanium at a thermal oxidation interface whenever sufficient quantities of silicon and germanium are available. Thus, performing the oxidation/anneal process on the silicon germanium alloy cladding 132 (see FIG. 8) results in diffusion of silicon towards the oxidation interface (i.e., outward) and condensing the germanium away from the oxidation interface (i.e., inward), thereby forming the germanium nanowire 134 and a silicon oxide shell 136 substantially surrounding the germanium nanowire 134. In an embodiment of the present disclosure, the germanium nanowire 134 may have a germanium content of between about 50% and 100%.

As also shown in FIG. 9, the oxidation/anneal process may turn a portion of the fin 112 closest to the germanium nanowire 134 to silicon oxide which decreases the fin height. However, depending on the oxidation/anneal process this may not occur.

It is understood, that although the present disclosure relates to germanium nanowire, this is for exemplary purposes only, and the present disclosure is not so limited. The nanowire may be fabricated from any appropriate material, particularly those materials which exhibit the migration/inter-diffuse properties of germanium and silicon, as will be understood to those skilled in the art.

In an embodiment of the present invention, the germanium nanowire 134 has a cross-sectional area that is substantially circular or oval, and thereby substantially cylindrical along its length. In an embodiment of the present invention, the germanium nanowire 134 may have an average diameter of between about 2 nm and 45 nm. In an embodiment of the present invention, the germanium nanowire 134 has a length of 5 um and 25 um. In an embodiment of the present invention, the germanium nanowire 134 has a diameter-to-length aspect ratio of between about 1:250 and 1:700.

Figure 10:
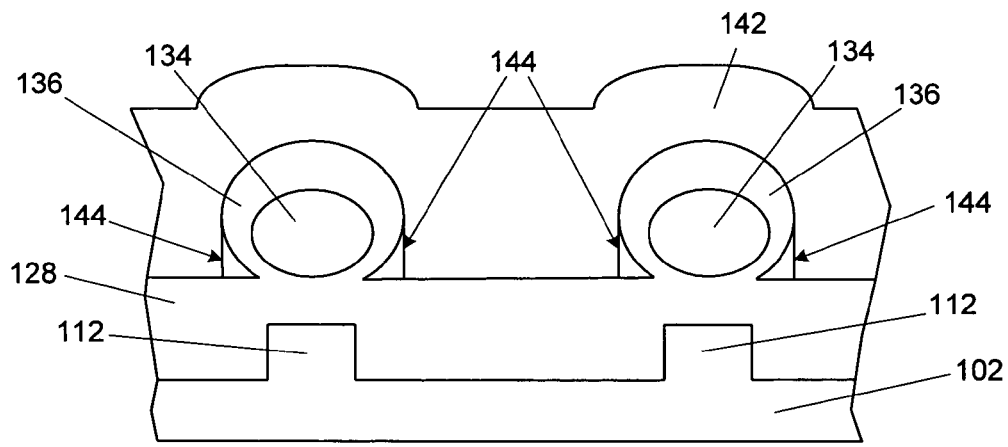
FIG. 10 is a side cross-sectional view of the structure of FIG. 9 after the deposition of a second dielectric material layer.

As shown in FIG. 10 and as set forth in block 220 of FIG. 19, a second dielectric material layer 142 may be deposited over the first dielectric material layer first surface 130 and the silicon oxide shell 136. The second dielectric material layer 142 may by deposited to completely fill the space between the silicon oxide shells 136 and may have an excess amount deposited to ensure complete coverage. The second dielectric material layer 142 may be deposited by any technique known in the art, including but not limited to, chemical vapor deposition, atomic layer deposition, physical vapor deposition, and the like.

As also shown in FIG. 10, the shape of the silicon oxide shell 136 creates voids 144, when the second dielectric material layer 142 is deposited.

Figure 11:
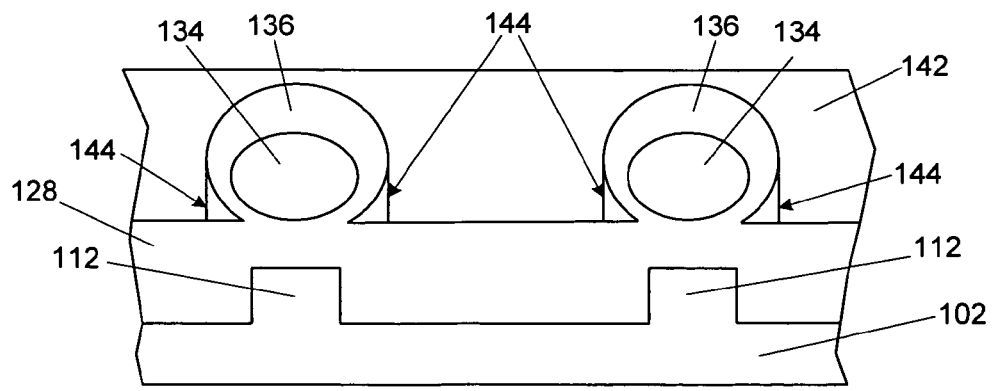
FIG. 11 is a side cross-sectional view of the structure of FIG. 10 after planarization of the second dielectric material layer.

As shown in FIG. 11 and as set forth in block 222 of FIG. 19, the second dielectric material layer 142 may be planarized. The planarization assists achieving an even and uniform etch in a subsequent step. The planarization may be achieved by technique known in the art, including but not limited to chemical mechanical polishing/planarization ("CMP") and wet or dry etching.

Figure 12:
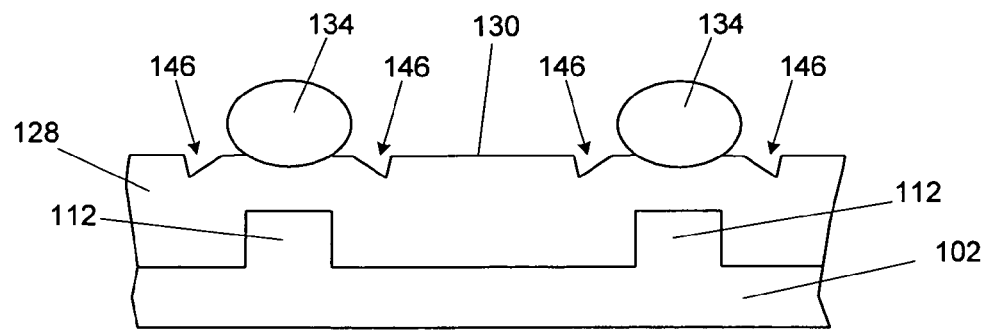
FIG. 12 is a side cross-sectional view of the structure of FIG. 11 after the removal of the second dielectric material layer, which creates divot channels in the first dielectric material layer.

As shown in FIG. 12 and as set forth in block 224 for FIG. 19, the germanium nanowire 134 is then exposed by etching the second dielectric material layer 142 and the silicon oxide shell 136. Exposing the germanium nanowires 134 may be achieved by etching techniques known in the art. However, the etching technique should be selective relative to germanium, such that the germanium nanowires 134 are not damaged by the etching. In one embodiment, the recessing may be achieved with a wet etch using a hydrofluoric acid solution.

As also shown in FIG. 12, the voids 144 (see FIG. 11) that were formed during the deposition of the second dielectric material layer 142 cause uneven etching when the first dielectric material layer 128 is exposed. The uneven etching may result in the shape of the voids 144 being translated into the first dielectric material layer 128, thereby forming divot channels 146 extending into the first dielectric material 128 from the first dielectric material first surface 130. These divot channels 146 can be over 300 angstroms deep. If the germanium nanowire 134 is to be used as a high mobility transistor channels in a transistor structure, the divot channels 146 would trap gate materials of a gate structure formed over the germanium nanowire 134, as will be understood to those skilled in the art. Further, the elimination of the divot channels 146 to successfully pattern a gate structure would require significant over-etching which may notch or undercut a top gate of a subsequently formed transistor gate structure, as will be understood by those skilled in the art.

Figure 13:
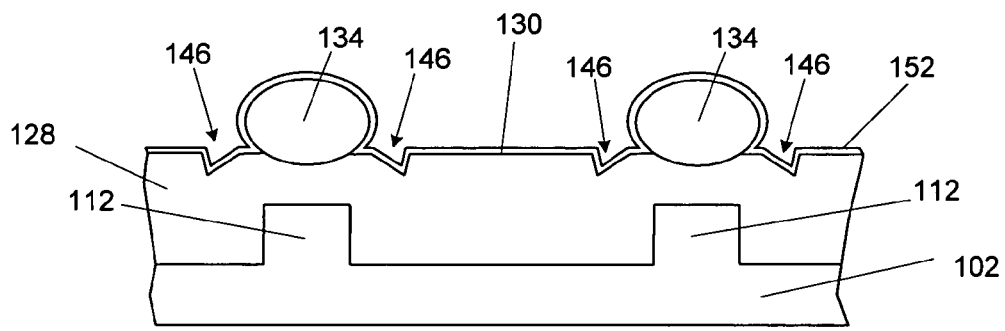
FIG. 13 is a side cross-sectional view of the structure of FIG. 12 after the deposition of a protective layer.

Therefore, in order to remove the divot channels 146 prior to the fabrication of the transistor, a protective layer 152 may be deposited over the germanium nanowires 134, over the first dielectric material layer first surface 130, and in the divot channels 146, as shown in FIG. 13 and as set forth in block 226 of FIG. 19. The protective layer 152 may be a silicon nitride dielectric layer or a high-K dielectric material, including but not limited to hafnium silicate, zirconium silicate, hafnium dioxide, and zirconium dioxide. If the protective layer 152 is a silicon nitride dielectric layer, it will be removed prior to the fabrication of a gate structure (not shown). If the protective layer 152 is a high-K dielectric material, it can be left on and the gate structure (not shown) fabricated thereon.

The protective layer 152 may be deposited by a conformal deposition technique, including, but not limited to physical vapor deposition, chemical vapor deposition, plasma enhanced chemical vapor deposition, and atomic layer deposition.

Figure 14:
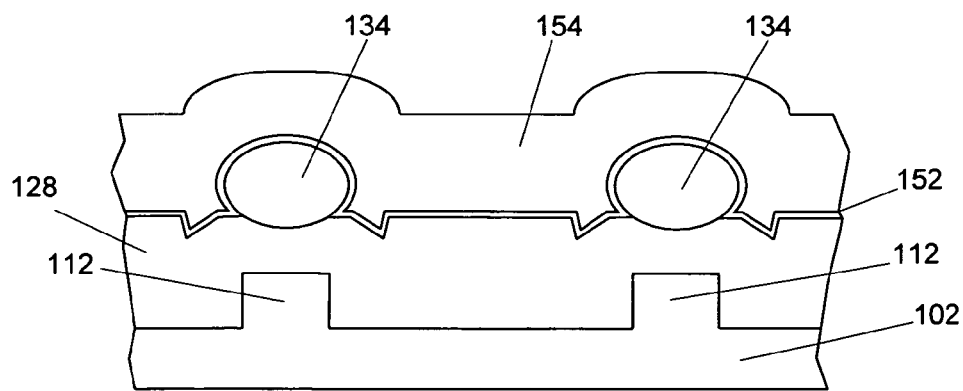
FIG. 14 is a side cross-sectional view of the structure of FIG. 13 after the deposition of a filler dielectric material layer.

As shown in FIG. 14 and as set forth in block 228 of FIG. 19, a filler dielectric material layer 154 may be deposited over the protective layer 152. The filler dielectric material layer 154 may by deposited to completely fill the space between the germanium nanowires 134 and may have an excess amount deposited to ensure complete coverage. The filler dielectric material layer 154 may be deposited by any technique known in the art, including but not limited to, chemical vapor deposition, atomic layer deposition, physical vapor deposition, and the like.

Figure 15:
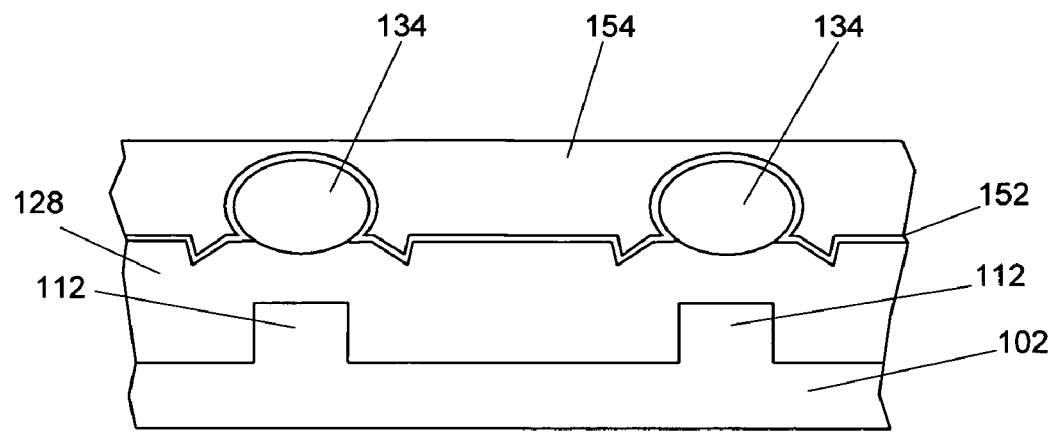
FIG. 15 is a side cross-sectional view of the structure of FIG. 14 after planarization of the filler dielectric material layer.

As shown in FIG. 15 and as set forth in block 230 of FIG. 19, the filler dielectric material layer 154 may be planarized. The planarization assists achieving an even and uniform etch in a subsequent step. The planarization may be achieved by technique known in the art, including but not limited to chemical mechanical polishing/planarization ("CMP") and wet or dry etching.

Figure 16:
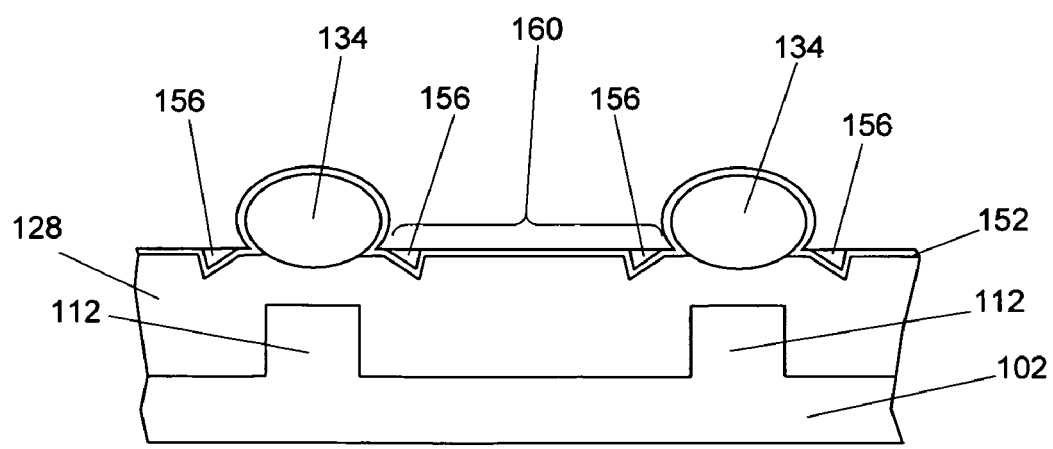
FIG. 16 is a side cross-sectional view of the structure of FIG. 15 after the partial removal of the filler dielectric material layer, wherein a portion of filler dielectric material layer remains in the divot channels.

As shown in FIG. 16 and as set forth in block 232 of FIG. 19, the protective layer 152 is then substantially exposed by etching the filler dielectric material layer 154, while leaving a portions 156 of the filler dielectric material layer 154 within the divot channels 146 (see FIG. 13). The filler dielectric material layer portion 156 may be substantially planar to the protective layer 152, which results in a substantially level isolation structure 160 between the germanium nanowires 134, upon which a gate structure (not shown) can be fabricated.

Exposing the protective layer 152 may be achieved by etching techniques known in the art. However, the etching technique will need to be selective relative to protective layer 152. In one embodiment, exposing the protective layer 152 may be achieved with a wet etch. In an embodiment, the protective layer 152 is silicon nitride and the etching solution is hydrofluoric acid based.

Figure 17:
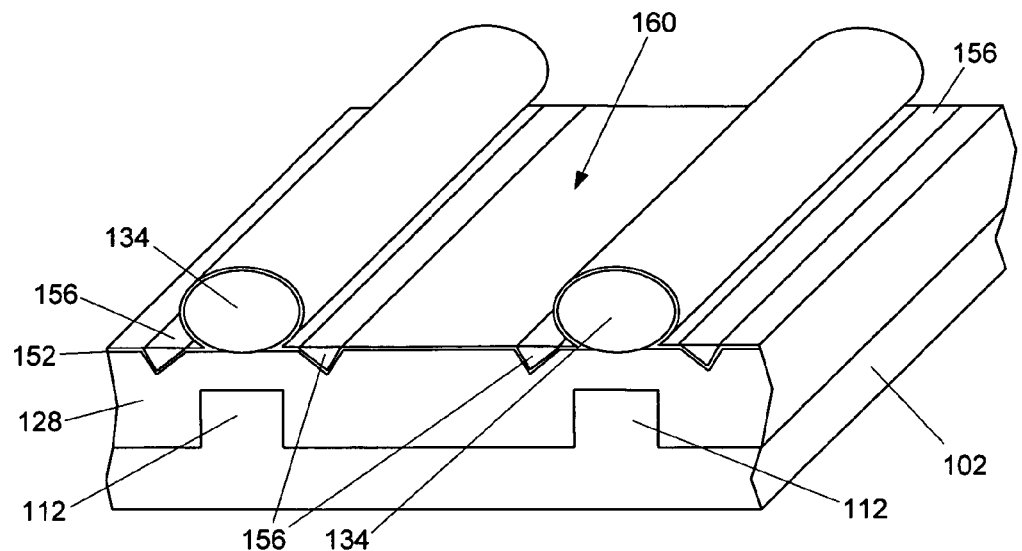
FIG. 17 is an oblique, cross-sectional view of the structure of FIG. 16.
Figure 18:
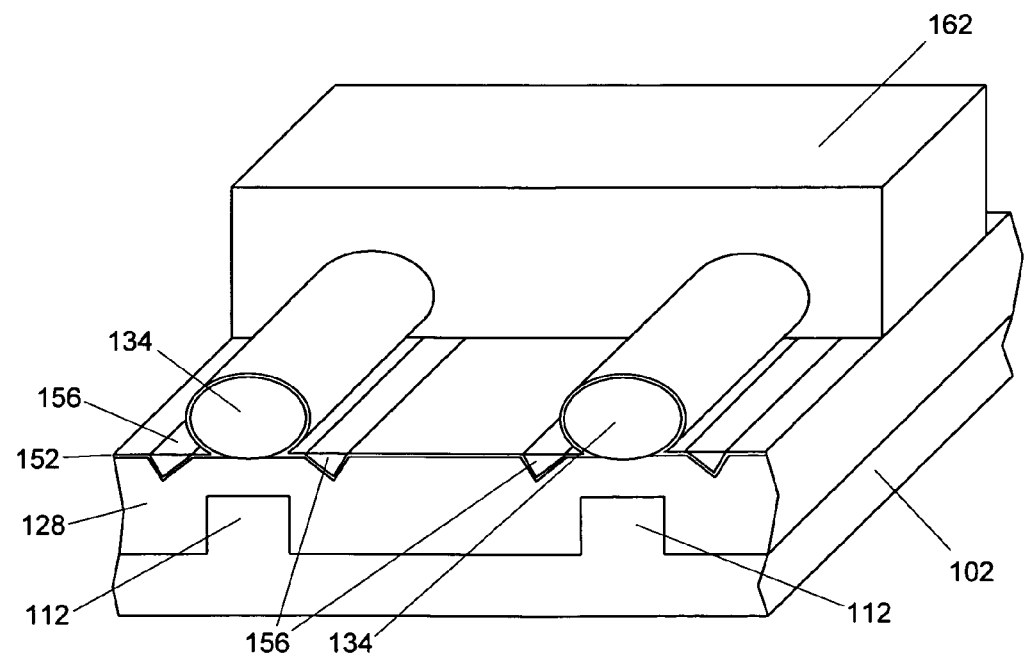
FIG. 18 is an oblique, cross-sectional view of a transistor gate with plurality of germanium nanowires as high mobility devices.

FIG. 17 is an oblique view of the isolation structure 160 as shown in FIG. 18. FIG. 18 is an oblique view of the structure of FIG. 17 having a gate structure 162 formed over the germanium nanowires 134, such that the germanium nanowires 134 act as high mobility channels for a transistor, as will be understood to those skilled in the art. The gate structure 162 is shown generically, as those skilled in the art are aware of the various ways in which the gate structure 162 may be structured and formed.

It is, of course, understood that although the description and the drawings relate to two nanowires being formed, the present disclosure is not so limited. The present disclosure is applicable to a single nanowire being formed, wherein the first dielectric material, the second dielectric material, protective layer, and/or filler material are deposited adjacent and/or on the nanowire, cladding, and/or fin. The present disclosure is also application to numerous nanowires being formed simultaneously.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A nanowire isolation structure formed by a method, comprising:
   forming at least one nanowire;
   forming a dielectric material adjacent to and in contact with the at least one nanowire, wherein forming the dielectric material includes forming at least one divot channel in the dielectric material;
   forming a high-K dielectric protective layer over the dielectric material and the nanowire;
   depositing a filler dielectric material over the protective layer; and
   removing a portion of the filler dielectric material to expose a portion of the protective layer and to leave a portion of the filler dielectric material within the divot channel.

2. The nanowire isolation structure of claim 1 wherein removing the portion of the filler dielectric material to expose a portion of the protective layer and leave a portion of the filler dielectric within the divot channel comprises removing the portion of the filler dielectric material to expose a portion of the protective layer and leave a portion of the filler dielectric within the divot channel which is substantially planar to the protective layer.

3. The nanowire isolation structure of claim 1 wherein forming at least one nanowire comprises forming at least one germanium nanowire.

4. The nanowire isolation structure of claim 3 wherein forming as least one germanium nanowire comprises forming at least one germanium nanowire having a germanium content of between about 50 and 100%.

5. A nanowire isolation structure formed by a method, comprising:
   forming at least one nanowire;
   forming a dielectric material adjacent to and in contact with the at least one nanowire, wherein forming the dielectric material includes forming at least one divot channel in the dielectric material;
   forming a silicon nitride protective layer over the dielectric material and the nanowire;
   depositing a filler dielectric material over the protective layer; and
   removing a portion of the filler dielectric material to expose a portion of the protective layer and to leave a portion of the filler dielectric material within the divot channel.

6. A nanowire isolation structure formed by a method, comprising:
   forming at least one nanowire, wherein forming that at least one nanowire comprises:
      patterning a mask on a substrate;
      etching the substrate to form at least one recess and at least one fin, each fin having a top surface and two opposing sides;
      removing the patterned mask;
      depositing the dielectric material over the recesses and fins;
      recessing the dielectric material to expose a portion of the sides of each fin;
      forming a germanium alloy cladding on the exposed sides and the top surface of each fin; and oxidizing and annealing the germanium alloy cladding to convert the germanium alloy cladding into a germanium nanowire;
   forming a dielectric material adjacent to and in contact with the at least one nanowire, wherein forming the dielectric material includes forming at least one divot channel in the dielectric material;
   forming a protective layer over the dielectric material and the nanowire;
   depositing a filler dielectric material over the protective layer; and
   removing a portion of the filler dielectric material to expose a portion of the protective layer and to leave a portion of the filler dielectric material within the divot channel.

7. The nanowire isolation structure of claim 6 wherein patterning a mask on a substrate comprises patterning a mask on a silicon-containing substrate.

8. The nanowire isolation structure of claim 7 wherein forming the germanium alloy cladding comprises forming a silicon germanium alloy cladding.

9. A nanowire isolation structure formed by a method, comprising:
   forming at least one nanowire;
   forming a dielectric material adjacent to and in contact with the at least one nanowire, wherein forming the dielectric material includes forming at least one divot channel in the dielectric material;
   wherein forming the at least one nanowire and forming the dielectric material adjacent the nanowire comprises:
      forming the at least one recess and at least one fin in a silicon-containing substrate, each fin having a top surface and two opposing sides;
      depositing the dielectric material over the recess and fin;
      recessing the dielectric material to expose a portion of at least one side of the fin;
      forming an alloy cladding on the exposed side and the top surface of each fin;
      converting the alloy cladding into a nanowire and an oxide shell substantially surrounding the nanowire;
      depositing a second dielectric material over the nanowire and dielectric material; and
      removing the second dielectric material and the oxide shells;
   forming a protective layer over the dielectric material and the nanowire;
   depositing a filler dielectric material over the protective layer; and
   removing a portion of the filler dielectric material to expose a portion of the protective layer and to leave a portion of the filler dielectric material within the divot channel.

10. The nanowire isolation structure of claim 5 wherein removing the portion of the filler dielectric material to expose a portion of the protective layer and leave a portion of the filler dielectric within the divot channel comprises removing the portion of the filler dielectric material to expose a portion of the protective layer and leave a portion of the filler dielectric within the divot channel which is substantially planar to the protective layer.

11. The nanowire isolation structure of claim 5 wherein forming at least one nanowire comprises forming at least one germanium nanowire.

12. The nanowire isolation structure of claim 11 wherein forming as least one germanium nanowire comprises forming at least one germanium nanowire having a germanium content of between about 50 and 100%.

13. The nanowire isolation structure of claim 6 wherein removing the portion of the filler dielectric material to expose a portion of the protective layer and leave a portion of the filler dielectric within the divot channel comprises removing the portion of the filler dielectric material to expose a portion of the protective layer and leave a portion of the filler dielectric within the divot channel which is substantially planar to the protective layer.

14. The nanowire isolation structure of claim 6 wherein forming at least one nanowire comprises forming at least one germanium nanowire.

15. The nanowire isolation structure of claim 11 wherein forming as least one germanium nanowire comprises forming at least one germanium nanowire having a germanium content of between about 50 and 100%.

16. The nanowire isolation structure of claim 9 wherein removing the portion of the filler dielectric material to expose a portion of the protective layer and leave a portion of the filler dielectric within the divot channel comprises removing the portion of the filler dielectric material to expose a portion of the protective layer and leave a portion of the filler dielectric within the divot channel which is substantially planar to the protective layer.

17. The nanowire isolation structure of claim 9 wherein forming at least one nanowire comprises forming at least one germanium nanowire.

18. The nanowire isolation structure of claim 17 wherein forming as least one germanium nanowire comprises forming at least one germanium nanowire having a germanium content of between about 50 and 100%.

\* \* \* \* \*

UNITED STATES PATENT AND TRADEMARK OFFICE
CERTIFICATE OF CORRECTION

PATENT NO. : 8,269,209 B2
APPLICATION NO. : 12/653847
DATED : September 18, 2012
INVENTOR(S) : Uday Shah et al.

It is certified that error appears in the above-identified patent and that said Letters Patent is hereby corrected as shown below:

In the Claims:

In column 9, line 29, in claim 4, delete "as least" and insert -- at least --, therefor.

In column 10, line 57, in claim 12, delete "as least" and insert -- at least --, therefor.

In column 11, line 5, in claim 15, delete "as least" and insert -- at least --, therefor.

In column 12, line 8, in claim 18, delete "as least" and insert -- at least --, therefor.

Signed and Sealed this
Eighth Day of January, 2013

David J. Kappos
*Director of the United States Patent and Trademark Office*